(12) United States Patent
Sano et al.

(10) Patent No.: US 11,411,074 B2
(45) Date of Patent: Aug. 9, 2022

(54) STRUCTURE AND METHOD OF PRODUCING THE SAME

(71) Applicant: KABUSHIKI KAISHA TOSHIBA, Tokyo (JP)

(72) Inventors: Mitsuo Sano, Kamakura (JP); Susumu Obata, Yokohama (JP); Kazuhito Higuchi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/173,258

(22) Filed: Feb. 11, 2021

(65) Prior Publication Data

US 2021/0296432 A1    Sep. 23, 2021

(30) Foreign Application Priority Data

Mar. 23, 2020    (JP) .............................. JP2020-050979

(51) Int. Cl.
| | |
|---|---|
| *H01L 49/02* | (2006.01) |
| *H01L 21/308* | (2006.01) |
| *H01L 21/306* | (2006.01) |
| *H01G 4/005* | (2006.01) |
| *B01J 23/40* | (2006.01) |

(52) U.S. Cl.
CPC .............. *H01L 28/92* (2013.01); *H01L 28/40* (2013.01); *H01L 28/91* (2013.01); *B01J 23/40* (2013.01); *H01G 4/005* (2013.01); *H01L 21/308* (2013.01); *H01L 21/30604* (2013.01); *H01L 28/60* (2013.01)

(58) Field of Classification Search
CPC ... H01L 28/40; H01L 28/82; H01L 28/90–92; H01G 4/005
See application file for complete search history.

(56) References Cited

U.S. PATENT DOCUMENTS

| | | | |
|---|---|---|---|
| 9,460,967 B2 * | 10/2016 | Asano | ................... H01L 23/562 |
| 10,090,158 B2 * | 10/2018 | Matsuo | .................... B01J 23/50 |
| 2020/0219656 A1 | 7/2020 | Higuchi et al. | |
| 2021/0020737 A1* | 1/2021 | Lu | ............................ H01L 28/75 |
| 2021/0226000 A1* | 7/2021 | Nishita | ............... H01L 27/0805 |

FOREIGN PATENT DOCUMENTS

| | | |
|---|---|---|
| JP | 04-026153 A | 1/1992 |
| JP | 06-310655 A | 11/1994 |
| JP | 2002-057304 A | 2/2002 |
| JP | WO2019/171750 A1 | 4/2020 |
| WO | WO 2019/171470 A1 | 9/2019 |

* cited by examiner

*Primary Examiner* — Jose R Diaz
(74) *Attorney, Agent, or Firm* — Oblon, McClelland, Maier & Neustadt, L.L.P.

(57) ABSTRACT

According to an embodiment, a structure includes a substrate including a semiconductor material, wherein the substrate is provided with one or more recesses each of which has a depth direction that is equal to a thickness direction of the substrate, and the one or more recesses include a sidewall on which a plurality of grooves each extending in the depth direction are provided.

12 Claims, 8 Drawing Sheets

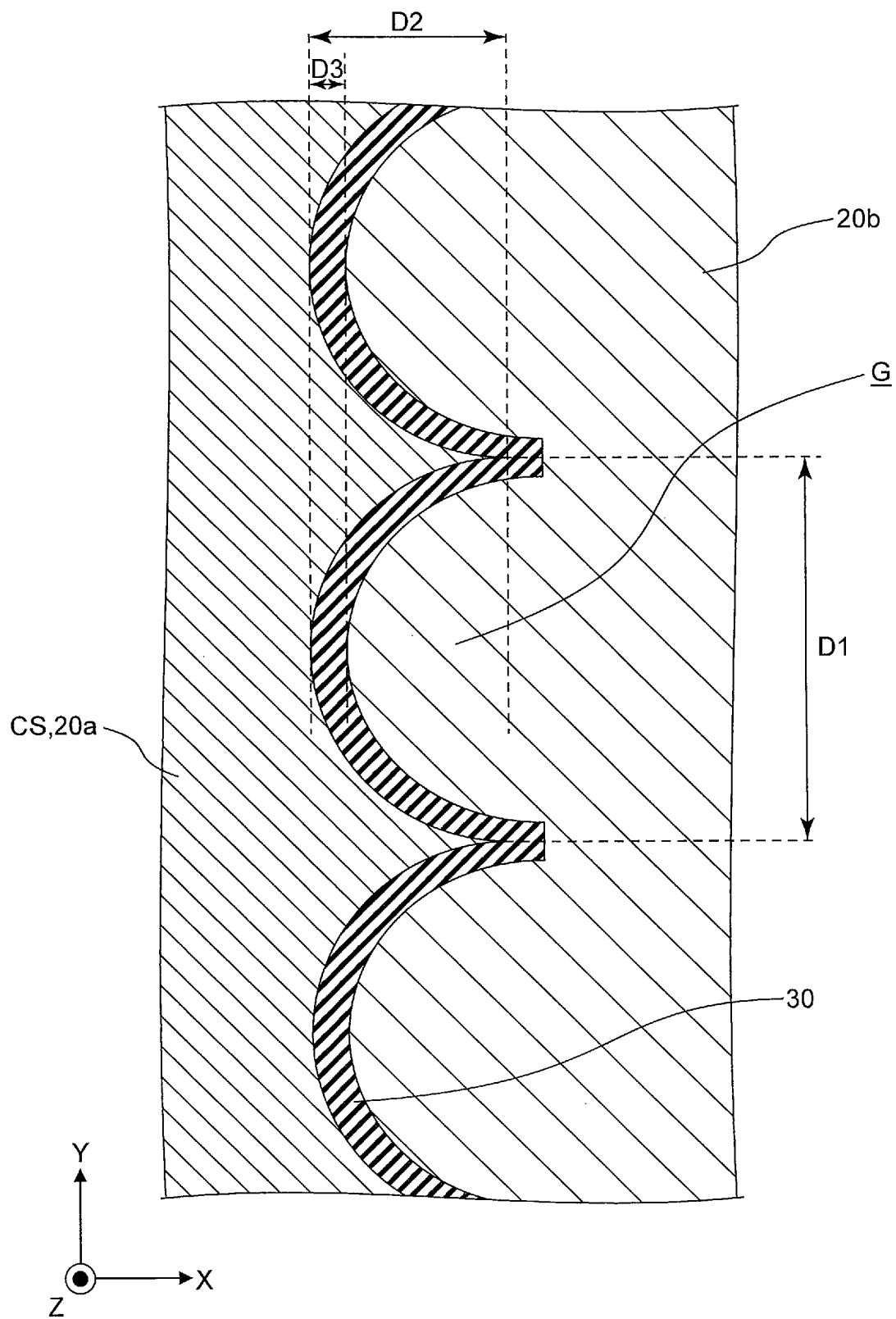
F I G. 4

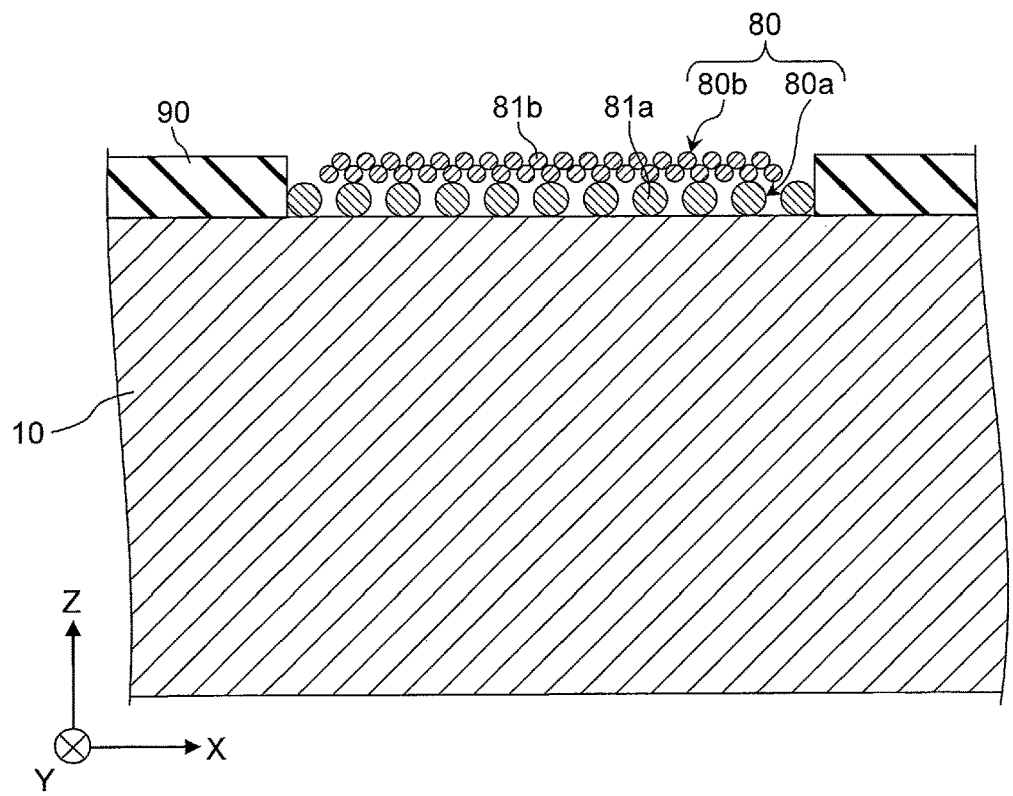
F I G. 9
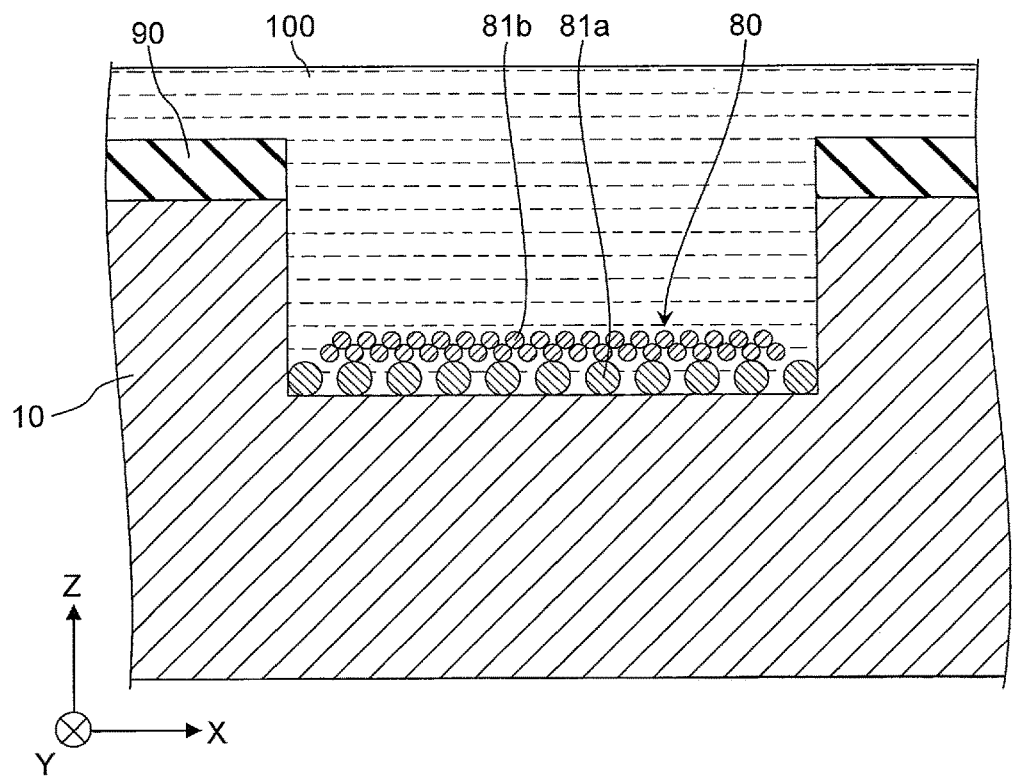
F I G. 10

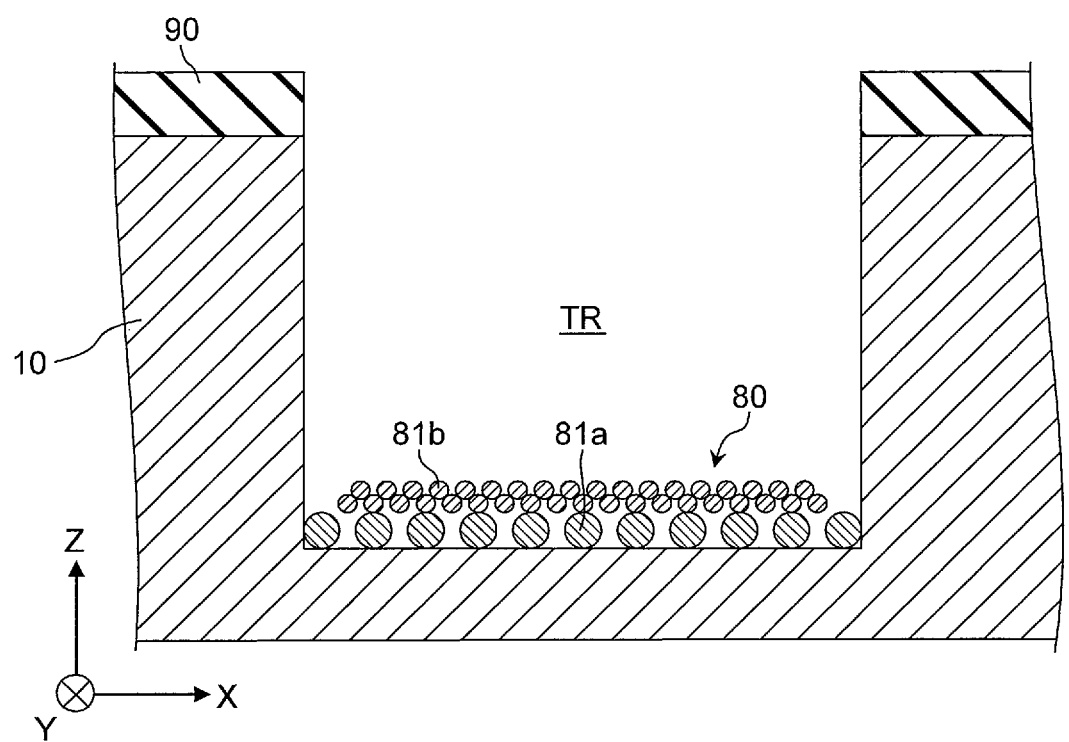
F I G. 11

STRUCTURE AND METHOD OF PRODUCING THE SAME

CROSS-REFERENCE TO RELATED APPLICATIONS

This application is based upon and claims the benefit of priority from Japanese Patent Applications No. 2020-050979, filed Mar. 23, 2020, the entire contents of which are incorporated herein by reference.

FIELD

Embodiments described herein relate generally to a structure.

BACKGROUND

In a structure having a semiconductor substrate with a trench formed thereon, a sidewall of the trench may be provided with a plurality of grooves each extending in a direction parallel to the surface of the semiconductor substrate. Use of such a structure can realize, for example, a capacitor having a large electric capacitance.

BRIEF DESCRIPTION OF THE DRAWINGS

FIG. 4 is a cross-sectional view of a sidewall of a trench included in the capacitor shown in FIGS. 1 and 2;

FIG. 9 is a sectional view showing a catalyst layer formation process in a second trench-formation method;

FIG. 10 is a sectional view showing an etching process in the second trench-formation method; and FIG. 11 is a cross-sectional view of a structure obtained through the process of FIG. 10.

DETAILED DESCRIPTION

Figure 1:
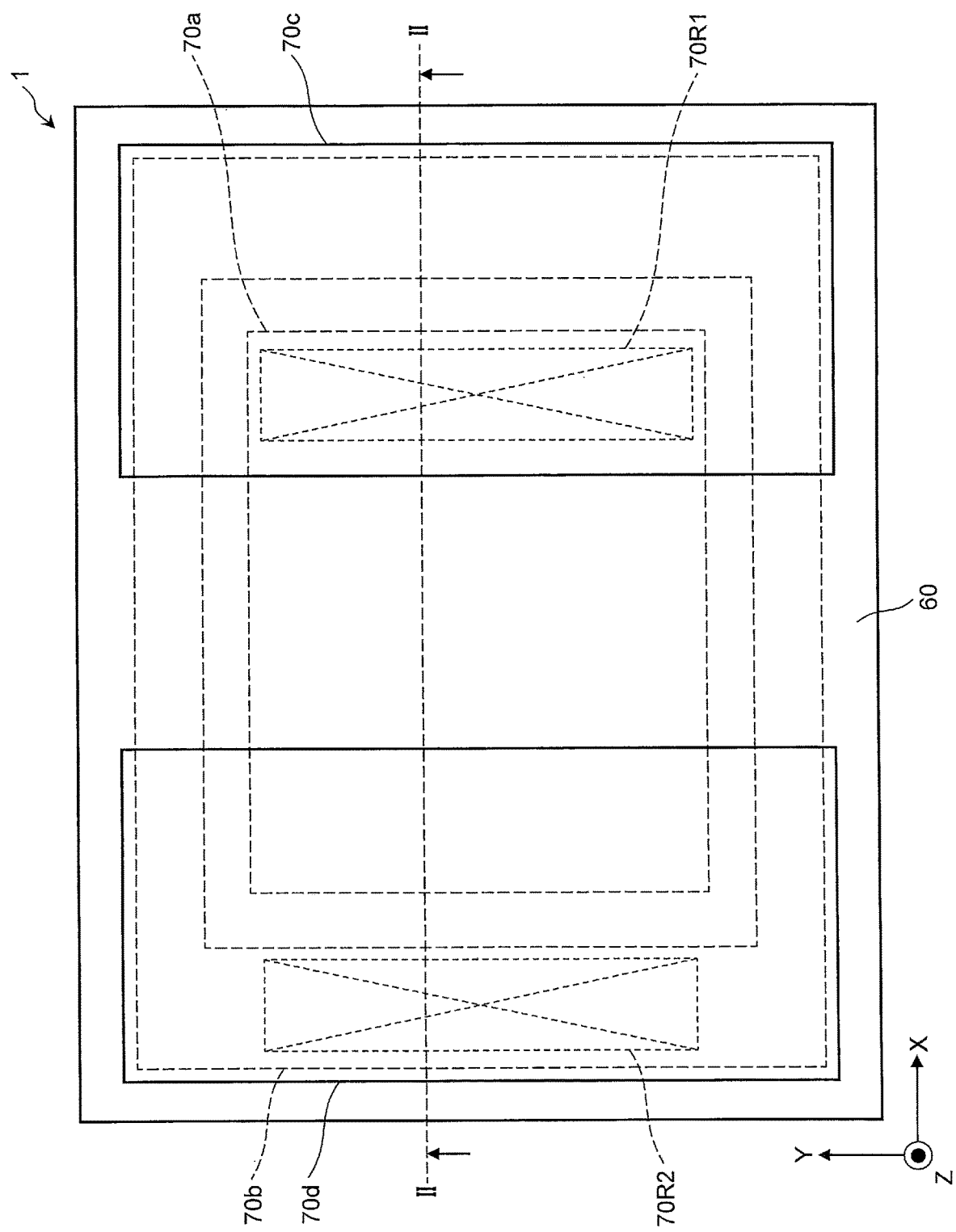
FIG. 1 is a top view of a capacitor according to one embodiment.

Embodiments will be described in detail below with reference to the accompanying drawings. Note that the same reference numerals denote constituent elements which achieve the same or similar functions throughout all the drawings, and repetitive explanations will be omitted.

<Configuration of Structure>

A structure according to an embodiment comprises a substrate including a semiconductor material, the substrate being provided with one or more recesses each of which has a depth direction that is equal to a thickness direction of the substrate, the one or more recesses including a sidewall on which a plurality of grooves each extending in the depth direction are provided.

Hereinafter, a capacitor will be described as an example of the structure.

Figure 2:
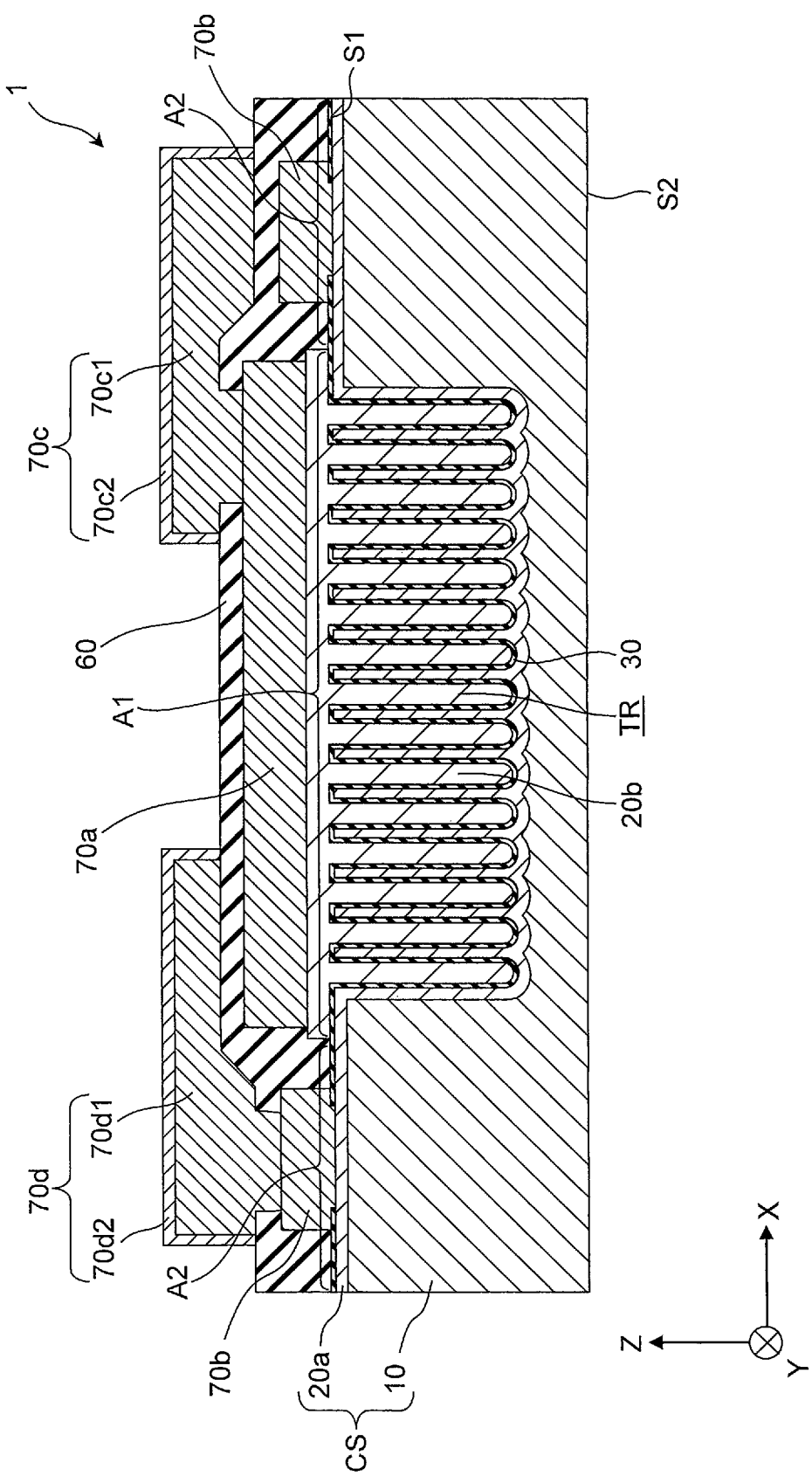
FIG. 2 is a cross-sectional view of the capacitor shown in FIG. 1 taken along a line II-II.

FIGS. 1 and 2 show a capacitor according to one embodiment.

A capacitor 1 shown in FIGS. 1 and 2 includes a conductive substrate CS, a conductive layer 20b, and a dielectric layer 30, as shown in FIG. 2.

In each figure, an X direction is a direction parallel to a main surface of the conductive substrate CS, and a Y direction is a direction parallel to the main surface of the conductive substrate CS and perpendicular to the X direction. In addition, a Z direction is a thickness direction of the conductive substrate CS, i.e., a direction perpendicular to the X direction and the Y direction.

The conductive substrate CS includes semiconductor material such silicon. The conductive substrate CS is a substrate having electrical conductivity at least in its surface facing the conductive layer 20b. The conductive substrate CS serves as a lower electrode of the capacitor.

The conductive substrate CS has a first main surface S1, a second main surface S2, and an end face extending from an edge of the first main surface S1 to an edge of the second main surface S2. The conductive substrate CS in this embodiment has a flat and approximately right-angled parallelepiped shape. The conductive substrate CS may have other shapes.

The first main surface S1, i.e., a top surface of the conductive substrate CS in this embodiment, includes a first region A1 and a second region A2. The first region A1 and the second region A2 are adjacent to each other. In this embodiment, the first region A1 is rectangular and the second region A2 surrounds the first region A1.

On the first region A1, a plurality of recesses TR each having a shape extending in one direction and arranged in the width direction are provided. The recesses TR are spaced apart from one another. In this embodiment, these recesses TR are a plurality of trenches arranged in the width direction, specifically, a plurality of trenches each extending in the Y direction and arranged in the X direction.

Portions of the conductive substrate CS each sandwiched between one and the other of adjacent recesses TR are projections. The projections each have a shape extending in the Y direction and are arranged in the X direction. That is, in each first region A1, a plurality of wall parts each having a shape extending in the Y direction and the Z direction and arranged in the X direction are provided as the projection.

The "length direction" of the recesses or the projections is a length direction of orthogonal projections of the recesses or the projections onto a plane perpendicular to the thickness direction of the conductive substrate.

A length of an opening of the recess TR is within a range of 5 µm to 500 µm according to an example, and within a range of 50 µm to 100 µm according to another example.

A width of the opening of the recess TR, i.e., a distance between projections adjacent in the width direction, is preferably 0.3 µm or more. When this width or distance is reduced, a larger electric capacitance can be achieved. However, when this width or distance is reduced, it becomes difficult to form a stacked structure including the dielectric layer 30 and the conductive layer 20b in the recesses TR.

A depth D1 of the recesses TR or a height of the projections is within a range of 5 µm to 300 µm according to an example, and within a range of 50 µm to 100 µm according to another example.

A distance between recesses TR adjacent in the width direction, i.e., a thickness D4 of the projection, is preferably 0.1 µm or more. When this distance or thickness D4 is reduced, a larger electric capacitance can be achieved. However, when this distance or thickness D4 is reduced, the projection is likely to be broken.

Note that in this embodiment, cross sections of the recesses TR perpendicular to the length directions are rectangular. However, these cross sections need not be rectangular. These cross sections may have, for example, a tapered shape.

As shown in FIG. 2, the conductive substrate CS includes a substrate 10 and a conductive layer 20a.

The substrate 10 has the same shape as that of the conductive substrate CS. The substrate 10 is a substrate containing semiconductor material, such as a semiconductor substrate. The substrate 10 is preferably a substrate containing silicon, such as a silicon substrate. Such a substrate can be processed using semiconductor processes.

The conductive layer 20a is provided on the substrate 10. The conductive layer 20a is made of, for example, polysilicon doped with impurities to improve its electrical conductivity, or a metal or alloy such as molybdenum, aluminum, gold, tungsten, platinum, nickel, or copper. The conductive layer 20a may have a single-layer structure or a multi-layer structure.

A thickness of the conductive layer 20a is preferably within a range of 0.05 μm to 1 μm, and more preferably within a range of 0.1 μm to 0.3 μm. If the conductive layer 20a is thin, a discontinuous portion may be generated in the conductive layer 20a, or a sheet resistance of the conductive layer 20a may be excessively increased. When the conductive layer 20a is thickened, manufacturing costs increase.

Here, as one example, the substrate 10 is a semiconductor substrate such as a silicon substrate, and the conductive layer 20a is a high-concentration doped layer that is a surface region of the semiconductor substrate doped with impurities at a high concentration. In this case, the projections, if thin enough, can be entirely doped with impurities at a high concentration.

If the substrate 10 has a high electrical conductivity, the conductive layer 20a may be omitted, and the substrate 10 may be used as the conductive substrate CS. For example, when the substrate 10 is a semiconductor substrate made of a semiconductor doped with P-type or N-type impurities, or a metal substrate, the conductive layer 20a can be omitted. In this case, at least a surface region of the substrate 10, e.g., the entire substrate 10, serves as the conductive layer 20a.

The conductive layer 20b serves as an upper electrode of the capacitor. The conductive layer 20b is provided on the first region A1, and covers the sidewalls and bottom surfaces of the recesses TR.

The conductive layer 20b is made of, for example, polysilicon doped with impurities to improve its electrical conductivity, or a metal or alloy such as molybdenum, aluminum, gold, tungsten, platinum, nickel, or copper. The conductive layer 20b may have a single-layer structure or a multi-layer structure.

A thickness of the conductive layer 20b is preferably within a range of 0.05 μm to 1 μm, and more preferably within a range of 0.1 μm to 0.3 μm. When the conductive layer 20b is thin, a discontinuous portion may be generated in the conductive layer 20b, or a sheet resistance of the conductive layer 20b may be excessively increased. When the conductive layer 20b is thick, it may be difficult to form the conductive layer 20a and the dielectric layer 30 with sufficient thicknesses.

In FIG. 2, the conductive layer 20b is provided so that the recesses TR are completely filled with the conductive layer 20b and the dielectric layer 30. The conductive layer 20b may be a layer that is conformal to a surface of the conductive substrate CS. That is, the conductive layer 20b may be a layer having an approximately uniform thickness. In this case, the recesses TR are not completely filled with the conductive layer 20b and the dielectric layer 30.

The dielectric layer 30 is interposed between the conductive substrate CS and the conductive layer 20b. The dielectric layer 30 is a layer that is conformal to the surface of the conductive substrate CS. The dielectric layer 30 electrically insulates the conductive substrate CS and the conductive layer 20b from each other.

The dielectric layer 30 is made of, for example, an organic dielectric or an inorganic dielectric. As the organic dielectric, for example, polyimide can be used. As the inorganic dielectric, a ferroelectric can be used. Paraelectrics such as silicon nitride, silicon oxide, silicon oxynitride, titanium oxide, and tantalum oxide, are preferable. These paraelectrics have a small change in dielectric constant with temperature. Therefore, when the paraelectrics are used for the dielectric layer 30, the heat resistance of the capacitor 1 can be improved.

A thickness of the dielectric layer 30 is preferably within a range of 0.005 μm to 0.5 μm, and more preferably within a range of 0.01 μm to 0.1 μm. When the dielectric layer 30 is thin, a discontinuous portion may be generated in the dielectric layer 30, and the conductive substrate CS and the conductive layer 20b may be short-circuited. Further, when the dielectric layer 30 is thinned, a withstand voltage is lowered even if there is no short circuit, which increases the possibility of short-circuiting when a voltage is applied. When the dielectric layer 30 is thickened, the withstand voltage increases, while the electric capacitance decreases.

The dielectric layer 30 is opened at a position of the second region A2. That is, the dielectric layer 30 allows the conductive layer 20a to be exposed at this position. Here, the portion of the dielectric layer 30 that is provided on the first main surface S1 is opened in a frame shape.

This capacitor 1 further includes an insulating layer 60, a first internal electrode 70a, a second internal electrode 70b, a first external electrode 70c, and a second external electrode 70d.

The first internal electrode 70a is provided on the first region A1. The first internal electrode 70a is electrically connected to the conductive layer 20b. Here, the first internal electrode 70a is a rectangular electrode located at a center of the first main surface S1.

The second internal electrode 70b is provided on the second region A2. The second internal electrode 70b is in contact with the conductive substrate CS at a position of the opening provided in the dielectric layer 30. Thereby, the second internal electrode 70b is electrically connected to the conductive substrate CS. Here, the second internal electrode 70b is a frame-shaped electrode arranged to surround the first internal electrode 70a.

The first internal electrode 70a and the second internal electrode 70b may have a single-layer structure or a multi-layer structure. Each layer constituting the first internal electrode 70a and the second internal electrode 70b is made of, for example, a metal such as molybdenum, aluminum, gold, tungsten, platinum, copper, nickel, or an alloy containing one or more of them.

The insulating layer 60 covers portions of the conductive layer 20b and the dielectric layer 30 that are located on the first main surface S1, and further covers the first internal electrode 70a and the second internal electrode 70b. The insulating layer 60 is partially opened at a position of a part of the first internal electrode 70a and a position of a part of the second internal electrode 70b.

The insulating layer 60 may have a single-layer structure or a multi-layer structure. Each layer constituting the insulating layer 60 is made of, for example, an inorganic insulator such as silicon nitride and silicon oxide, or an organic insulator such as polyimide and novolac resin.

The first external electrode 70c is provided on the insulating layer 60. The first external electrode 70c is in contact with the first internal electrode 70a at a position of one or more openings provided in the insulating layer 60. Thereby, the first external electrode 70c is electrically connected to the first internal electrode 70a. In FIG. 1, a region 70R1 is a region where the first external electrode 70c and the first internal electrode 70a are in contact with each other.

The second external electrode 70d is provided on the insulating layer 60. The second external electrode 70d is in contact with the second internal electrode 70b at a position of the remaining opening(s) provided in the insulating layer 60. Thereby, the second external electrode 70d is electrically connected to the second internal electrode 70b. In FIG. 1, a region 70R2 is a region where the second external electrode 70d and the second internal electrode 70b are in contact with each other.

The first external electrode 70c has a stacked structure including a first metal layer 70c1 and a second metal layer 70c2. The second external electrode 70d has a stacked structure including a first metal layer 70d1 and a second metal layer 70d2.

The first metal layers 70c1 and 70d1 are made of, for example, copper. The second metal layers 70c2 and 70d2 cover upper and end faces of the first metal layers 70c1 and 70d1, respectively. The second metal layers 70c2 and 70d2 are constituted by, for example, a stacked film of a nickel or nickel alloy layer and a gold layer. The second metal layers 70c2 and 70d2 can be omitted.

The first external electrode 70c or the first internal electrode 70a may further include a barrier layer at a position adjacent to an interface therebetween. The second external electrode 70d or the second internal electrode 70b may further include a barrier layer at a position adjacent to an interface therebetween, too. As a material of the barrier layer, for example, titanium can be used.

As described above, the capacitor 1 has the recesses TR provided on the first main surface S1. As will be described below, the recesses TR of the capacitor 1 have a sidewall on which a plurality of grooves each extending in a depth direction of the recesses are provided. The stacked structure including the dielectric layer 30 and the conductive layer 20b is provided not only on the first main surface S1 but also on the sidewalls and bottom surfaces of the recesses TR. Therefore, this capacitor 1 can achieve a large electric capacitance.

The grooves provided on the sidewall of the recess TR will be described with reference to FIG. 3 and FIG. 4.

Figure 3:
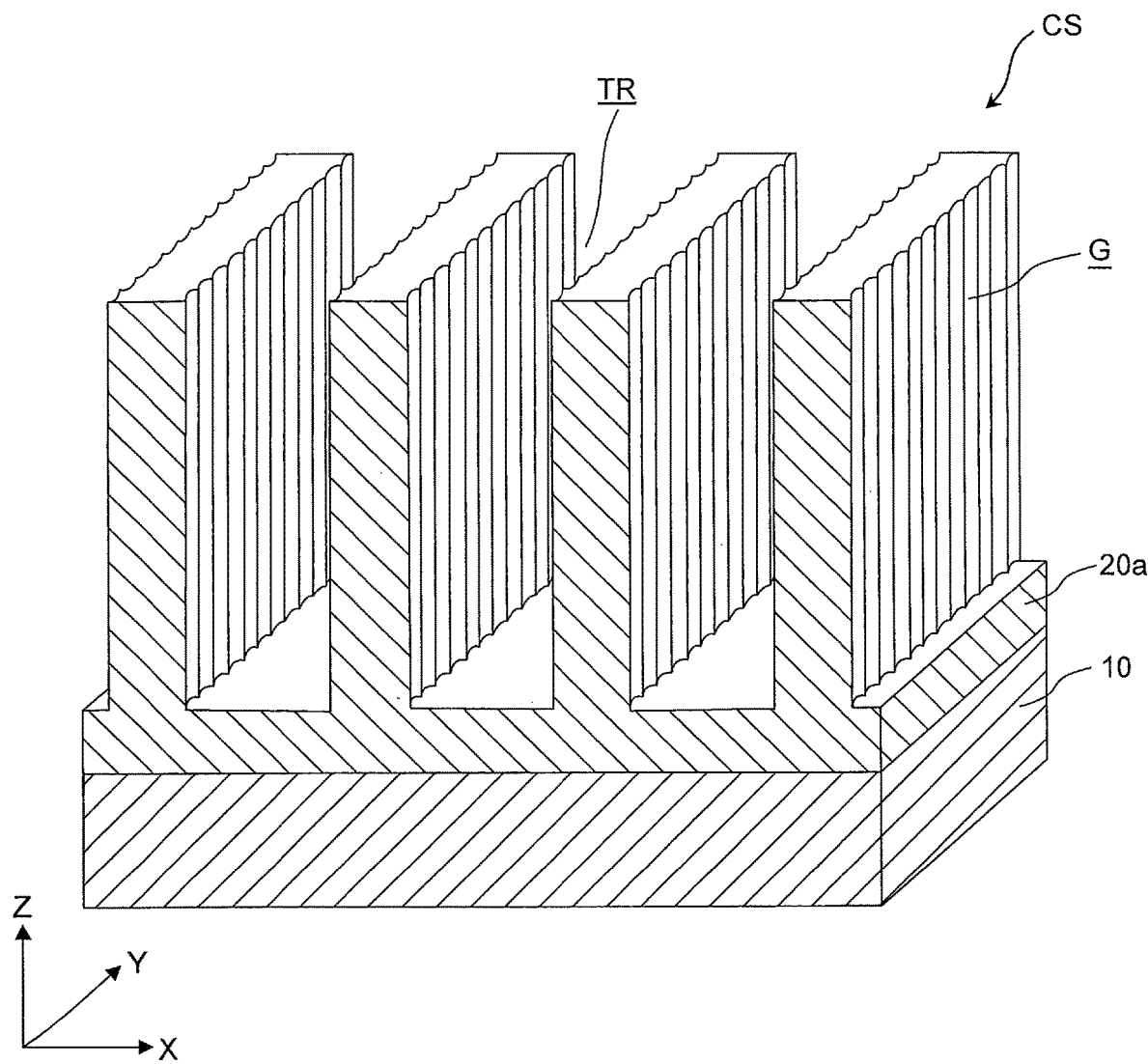
FIG. 3 is a perspective view of a conductive substrate included in the capacitor shown in FIGS. 1 and 2.

FIG. 3 is a perspective view of the conductive substrate CS. FIG. 4 is a cross-sectional view of a sidewall and a portion in proximity thereto of the recess TR, which is a cross-sectional view perpendicular to the depth direction of the recess TR.

As shown in FIG. 3 and FIG. 4, the plurality of grooves G are provided on sidewalls of the recesses TR and each extend in the depth direction of the recesses TR. The grooves G are adjacent to each other in their width direction. That is, the grooves G provided on the sidewall of the recess TR each extend in the Z direction and are arranged in the Y direction.

If the length direction of the grooves G is approximately parallel to the first main surface S1, a substance that should be removed by washing in production of the capacitor 1 would be likely to remain in the grooves G. If the substance that should be removed by washing remains in the grooves G, for example, the conductive substrate CS and the conductive layer 20b would be likely to be short-circuited, or a withstand voltage may be lowered even if there is no short circuit, which may increase the possibility of short-circuiting when a voltage is applied.

On the other hand, in the above capacitor 1, the length direction of the grooves G is parallel to the depth direction of the recesses TR. Accordingly, the substance that should be removed by washing in the production of the capacitor 1 is unlikely to remain in the grooves G of the above capacitor 1. That is, the above-described structure of the capacitor 1 makes it easy to wash the recesses TR regardless of the presence of the grooves G on the sidewalls of the recesses TR. Therefore, the above structure enables a high-yield production of capacitors having high reliability.

In the structure shown in FIG. 3 and FIG. 4, adjacent grooves G on each sidewall are in contact with each other at their edges. The adjacent grooves G may be spaced apart from each other.

According to one example, one or more grooves G are different in width D1 from other one or more grooves G. The grooves G may be equal in width D1.

An average width $Av_{D1}$ of the grooves G is preferably within a range of 5 nm to 300 nm and more preferably within a range of 10 nm to 100 nm.

When the average width $Av_{D1}$ of the grooves G is excessively small, the dielectric layer 30 may almost completely fill the grooves G or block the opening of the grooves G. In this case, it is difficult to achieve a large capacitance. In addition, the lower the average width $Av_{D1}$ of the grooves G is, the more likely the substance that should be removed by washing is to remain in the grooves G.

The greater the average width $Av_{D1}$ of the grooves G is, the greater the depth D2 of the grooves G also needs to be so as to attain a large electric capacitance. When the groove G has an excessively large depth D2, the projection sandwiched between adjacent recesses TR also needs to have a greater thickness. The greater the thickness of the projection is, the smaller the number of the recesses TR needs to be. The smaller the number of the recesses TR is, the lower the electric capacitance of the capacitor 1.

A ratio $Av_{D1}/Av_{D5}$ of the average width $Av_{D1}$ to an average center-to-center distance $Av_{D5}$ of adjacent grooves G1 is preferably within a range of 0.3 to 1 and more preferably within a range of 0.5 or more and less than 1.

Here, the center-to-center distance of the adjacent grooves G1 is a distance between a plane halving one of the adjacent grooves G1 in the width direction and being perpendicular to the sidewall and a plane halving the other of the adjacent grooves G1 in the width direction and being perpendicular to the sidewall.

The lower the ratio $Av_{D1}/Av_{D5}$ is, the more likely the adjacent grooves G1 are to partially overlap with each other. The greater the ratio $Av_{D1}/Av_{D5}$ is, the more difficult a large electric capacitance is to achieve.

According to one example, one or more grooves G are different in depth D2 from the other one or more grooves G. The grooves G may be equal in depth D2.

An average depth $Av_{D2}$ of the grooves G1 is preferably within a range of 2.5 nm to 150 nm and more preferably within a range of 5 nm to 50 nm.

When the average depth $Av_{D2}$ of the grooves G1 is excessively small, the dielectric layer 30 may almost completely fill the grooves G or block the opening of the grooves G. In this case, it is difficult to achieve a large capacitance. On the other hand, the average depth $Av_{D2}$ of the grooves G1 being excessively large would increase the possibility that the substance that should be removed by washing will remain in the grooves G.

A ratio $Av_{D2}/Av_{D1}$ of the average depth $Av_{D2}$ to the average width $Av_{D1}$ of the grooves G is preferably within a range of 0.01 to 100 and more preferably within a range of 0.1 to 10. To achieve a large electric capacitance, a large ratio $Av_{D2}/Av_{D1}$ is favorable. However, increasing the ratio $Av_{D2}/Av_{D1}$ would increase the possibility that the substance that should be removed by washing will remain in the grooves G.

A ratio $Av_{D2}/D4$ of the average depth $Av_{D2}$ of the grooves G to a thickness D4 of a projection sandwiched between adjacent recesses TR is preferably within a range of 0.005 to 0.3 and more preferably within a range of 0.01 to 0.1. To achieve a large electric capacitance, a large ratio $Av_{D2}/D4$ is favorable. However, increasing the ratio $Av_{D2}/D4$ would decrease the strength of the projection.

A ratio $D3/Av_{D1}$ of a thickness D3 of the dielectric layer 30 to the average width $Av_{D1}$ of the grooves G is preferably within a range of 0.01 or more and less than 0.5, and more preferably within a range of 0.1 or more and less than 0.5. When the ratio $D3/Av_{D1}$ is excessively large, the dielectric layer 30 may almost completely fill the grooves G or block the openings of the grooves G. When the ratio $D3/Av_{D1}$ is excessively small, the conductive substrate CS and the conductive layer 20b are more likely to be short-circuited, or a withstand voltage may be lowered even if there is no short circuit, which increases the possibility of short-circuiting when a voltage is applied.

<First Production Method for Structure>

A first method of producing a structure according to an embodiment, comprises:

forming a mask layer having one or more openings on one main surface of a substrate including a semiconductor material;

forming a catalyst layer on a region of the main surface that corresponds to the one or more openings, the catalyst layer being formed of a plurality of catalyst particles each including a noble metal, and having gaps between the plurality of catalyst particles;

supplying an etching agent to the catalyst layer to etch the region with an assist from the catalyst layer as a catalyst, thereby forming one or more recesses each having a plurality of grooves each extending in a depth direction, on a sidewall, and a plurality of etching residues each having a needle shape extending in the depth direction, on a bottom; and removing the plurality of etching residues through etching.

The first production method will be described below with reference to FIGS. 5 to 8, taking the above-described capacitor 1 as an example structure.

Figure 5:
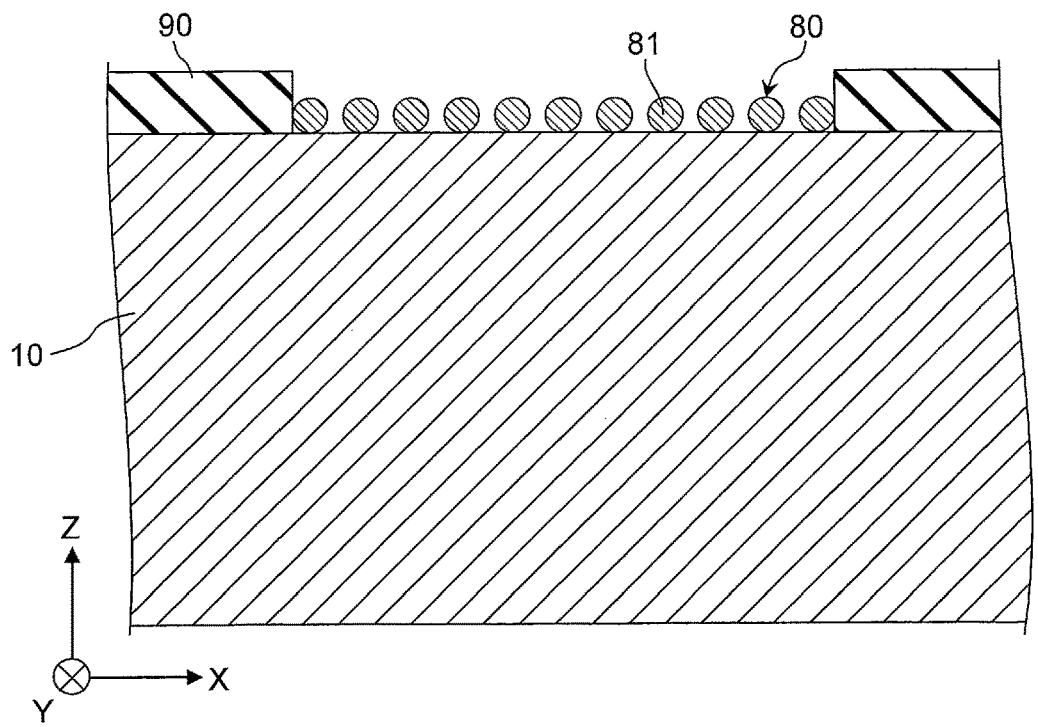
FIG. 5 is a sectional view showing a catalyst layer formation process in a first trench-formation method.

In this method, the substrate 10 shown in FIG. 5 is first prepared. Here, as an example, it is supposed that the substrate 10 is a single-crystal silicon wafer. A plane orientation of the single-crystal silicon wafer is not particularly limited, but in this embodiment, a silicon wafer whose main surface is a (100) plane is used.

As the substrate 10, a silicon wafer whose main surface is a (110) plane can also be used.

Next, the recesses are formed on the substrate 10 by MacEtch (Metal-Assisted Chemical Etching).

That is, as shown in FIG. 5, a catalyst layer 80 containing a noble metal is first formed on the substrate 10. The catalyst layer 80 is formed so as to partially cover one main surface (hereinafter, referred to as the "first surface") of the substrate 10.

Specifically, a mask layer 90 is first formed on the first surface of the substrate 10.

The mask layer 90 has an opening at a position corresponding to a recess TR. The mask layer 90 prevents a noble metal, to be described later, from coming into contact with portions of the first surface that are covered with the mask layer 90.

Examples of the material of the mask layer 90 include organic materials such as polyimide, fluororesin, phenol resin, acrylic resin, and novolac resin, and inorganic materials such as silicon oxide and silicon nitride.

The mask layer 90 can be formed by, for example, existing semiconductor processes. The mask layer 90 made of an organic material may be formed by, for example, photolithography. The mask layer 90 made of an inorganic material may be formed by, for example, formation of an inorganic material layer by a vapor deposition method, formation of a mask by photolithography, and patterning of the inorganic material layer by etching. Alternatively, the mask layer 90 made of an inorganic material may be formed by oxidation or nitriding of the surface region of the substrate 10, formation of a mask by photolithography, and patterning of an oxide or nitride layer by etching. The mask layer 90 can be omitted.

Next, the catalyst layer 80 is formed on regions of the first surface that are not covered with the mask layer 90. The catalyst layer 80 is a particulate layer formed of catalyst particles 81 containing a noble metal. The catalyst layer 80 has gaps between catalyst particles 81.

The catalyst particle 81 has a diameter corresponding to a width D1 of the groove G to be formed. An average particle size of the catalyst particles 81 is preferably within a range of 5 nm to 500 nm and more preferably within a range of 10 nm to 300 nm.

Note that the "average particle size" of the catalyst particles is a value obtained by the following method. First, a picture of the catalyst layer is taken through an electron microscope. Next, the areas of the catalyst particles obtained from this picture are averaged. A diameter of a circle having the same area as the resultant average area is defined as an average particle size of the catalyst particles.

The catalyst layer 80 is formed so that the catalyst particles 81 are not stacked in multiple layers but are distributed at a low density. Preferably, the catalyst layer 80 is formed so that a coverage rate, a proportion of a total area of regions of a semiconductor surface that are covered with the catalyst particles in an area of a region of the semiconductor surface that is not covered with the mask layer, will be from 10% to 50%. Note that the "coverage ratio" of the catalyst particles is a value obtained by the following method. First, a picture of the catalyst layer is taken through an electron microscope. Next, the areas of the catalyst particles obtained from this picture are averaged. A value obtained by dividing the resultant average area by the semiconductor surface area not covered with the mask layer is defined as a coverage ratio.

The noble metal is, for example, one or more of gold, silver, platinum, rhodium, palladium, and ruthenium. The catalyst layer 80 and the catalyst particles 81 may further contain a metal other than a noble metal, such as titanium.

The catalyst layer 80 can be formed by, for example, electroplating, reduction plating, or displacement plating.

The catalyst layer 80 can also be formed by application of a dispersion containing noble metal particles, or vapor deposition such as evaporation or sputtering. Of these methods, the displacement plating is particularly favorable because it is possible to directly and evenly deposit the noble metal on the regions of the first surface that are not covered with the mask layer 90. As one example, the formation of the catalyst layer 80 by displacement plating on the substrate 10 made of silicon will be described below.

The displacement plating is a type of electroless plating. The displacement plating performed herein uses a plating solution that includes a noble metal source producing an ion containing the noble metal in water, and hydrogen fluoride. Since the plating solution is for displacement plating, the solution does not contain a reducing agent, unlike the plating solution used in an autocatalytic electroless plating.

The noble metal source producing an ion containing the noble metal in water is, for example, a gold source producing an ion containing gold. As the gold source, for example, gold sulfate or a non-cyan type source such as a gold source producing a tetrachloroaurate (III) ion in water is preferred. The gold source producing the tetrachloroaurate (III) ion in water is, for example, tetrachloroauric (III) acid or a tetrachloroaurate (III) such as potassium tetrachloroaurate (III). These compounds or the tetrachloroaurate (III) ion are more stable than gold sulfate in a range of low pH.

When the substrate 10 is immersed in the displacement plating solution, a native oxide film is removed from the surface of the substrate 10, and a noble metal, i.e. gold in this example, is deposited on a region of the surface of the substrate 10 which is not covered with the mask layer 90. Thus, the catalyst layer 80 formed of the catalyst particles 81 is obtained.

A concentration of the noble metal source in the plating solution is preferably within a range of 0.0001 mol/L to 0.01 mol/L, and more preferably within a range of 0.0005 mol/L to 0.005 mol/L. When the concentration is higher or lower than the above range, it is difficult for the noble metal to be deposited in a form of particles.

Hydrogen fluoride serves to remove an oxidation film from a silicon surface, as described below. Herein, as one example, the structure 1 has a surface made of silicon, and the noble metal source is the gold source producing a tetrachloroaurate (III) ion.

In the displacement plating, oxidation of silicon and reduction of gold contained in the tetrachloroauric (III) acid ion occur, resulting in deposition of gold on the silicon surface. However, a silicon oxide produced in the reaction passivates silicon.

Hydrogen fluoride reacts with silicon oxide to produce $SiF_6^{2-}$, $H^+$, and water. That is, hydrogen fluoride removes a passivation film from the silicon surface. As such, hydrogen fluoride prevents deposition of gold from stopping immediately.

A concentration of hydrogen fluoride in the displacement plating solution is preferably within a range of 0.01 mol/L to 5 mol/L and more preferably within a range of 0.5 mol/L to 2 mol/L. When the concentration of hydrogen fluoride is low, it is difficult to obtain the catalyst layer 80 in which the catalyst particles 81 with an adequate size are distributed at a low density. When the concentration of hydrogen fluoride is high, dissolution of the semiconductor surface may progress to adversely affect etching.

The displacement plating solution may further include an adjusting agent. The adjusting agent adjusts the pH of the plating solution or adjusts zeta potential at an interface between the mask layer 90 and the plating solution (a sliding surface near the mask layer 90).

As the adjusting agent, for example, an organic additive can be used. The organic additive may be selected from, for example, polymeric additives such as polyethylene glycol, a polycarboxylate salt, and salts of naphthalenesulfonic acid-formalin condensate; nonionic surfactants such as sorbitan fatty acid ester, sucrose fatty acid ester, polyoxyethylene alkyl ether, polyoxyethylene alkyl phenyl ether, and polyoxyethylene polyoxypropylene glycol; anionic surfactants such as polyoxyethylene alkyl ether carboxylate, sodium dodecyl sulfate, and sodium alkyl benzene sulfonate; or a combination thereof.

When the organic additive is a polymer compound such as polyethylene glycol, the average molecular weight is preferably within a range of 200 to 500,000, more preferably within a range of 1,000 to 100,000, and more preferably within a range of 6,000 to 20,000. When the organic additive is a polymer compound, the average molecular weight is a weight average molecular weight. When the organic additive is a polymer compound having a small average molecular weight, the effect of suppressing attachment of the catalyst particles 81 to an undesired position is small. When the average molecular weight is large, a linear chain structure is long and thus causes steric hindrance, which enhances the suppressing effect.

A concentration of the organic additive in the plating solution is preferably within a range of 0.0001 to 10% by mass, more preferably within a range of 0.0005 to 5% by mass, more preferably within a range of 0.001 to 1% by mass, and still more preferably within a range of 0.001 to 0.01% by mass. When the concentration of the organic additive is low, the effect of suppressing attachment of the catalyst particles 81 to an undesired position is small. When the concentration of the organic additive is excessively high, an influence of the concentration on the shape of the catalyst particles 81 becomes large.

As the adjusting agent, an inorganic additive may be used. As the inorganic additive, for example, ammonium fluoride, ammonia, sodium hydroxide, potassium hydroxide, and the like can be used.

The inorganic additive is used at such a concentration that zeta potential at an interface between the mask layer 90 and the plating solution is preferably within a range of a negative value or within a range of 10 mV to −10 mV, and more preferably within a range of 0 mV to −100 mV.

A pH value of the plating solution is preferably within a range of 1 to 6, and more preferably within a range of 4 to 6. When the pH value is lower, a zeta potential at an interface between the mask layer 90 and the plating solution tends to be higher. When the pH value is higher, the amount of protons in the solution is decreased, and thus, the zeta potential is shifted to a negative direction.

A temperature of a plating bath is preferably within a range of 0 to 50° C., and more preferably within a range of 15 to 35° C.

When the substrate 10 on which the mask layer 90 is formed is immersed in the displacement plating solution, the catalyst layer 80 composed of the catalyst particles 81 distributed at a low density is formed on a region of the semiconductor surface that is not covered with the mask layer 90.

According to one example, the plating solution is an aqueous solution containing 1 mmol/L of tetrchloroaurate (III) and 100 mmol/L of hydrogen fluoride. When such a displacement plating solution is used, a plating is performed at, for example, 25° C. for one minute.

Next, the substrate 10 is etched with an assist from a noble metal as a catalyst to form the recesses on the first surface.

Figure 6:
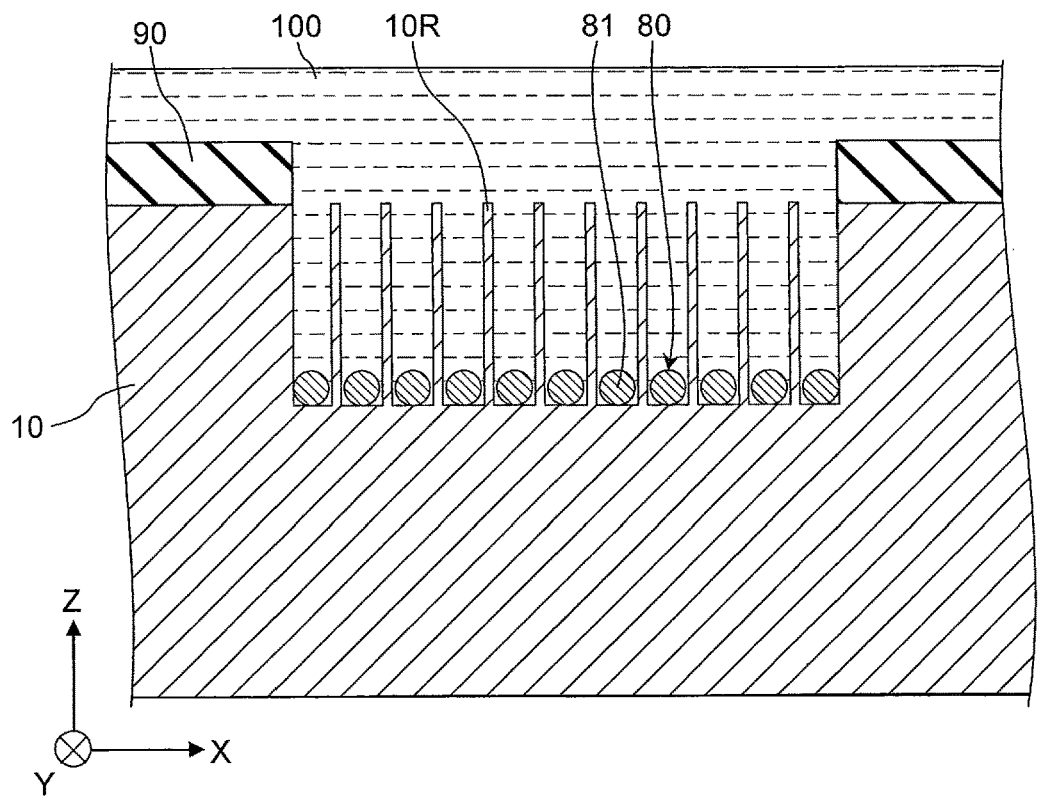
FIG. 6 is a sectional view showing a first etching process in the first trench-formation method.

Specifically, as shown in FIG. 6, the substrate 10 is etched with an etching agent 100. For example, the substrate 10 is immersed in the etching agent 100 in liquid form to bring the etching agent 100 into contact with the substrate 10.

The etching agent 100 contains an oxidizer and hydrogen fluoride.

A concentration of hydrogen fluoride in the etching agent 100 is preferably within a range of 1 mol/L to 20 mol/L, more preferably within a range of 5 mol/L to 10 mol/L, and yet further preferably within a range of 3 mol/L to 7 mol/L. When the hydrogen fluoride concentration is low, it is difficult to achieve a high etching rate. When the hydrogen fluoride concentration is high, excess side etching may occur.

The oxidizer is selected from, for example, hydrogen peroxide, nitric acid, $AgNO_3$, $KAuCl_4$, $HAuCl_4$, $K_2PtCl_6$, $H_2PtCl_6$, $Fe(NO_3)_3$, $Ni(NO_3)_2$, $Mg(NO_3)_2$, $Na_2S_2O_8$, $K_2S_2O_8$, $KMnO_4$, or $K_2Cr_2O_7$. Hydrogen peroxide is favorable as the oxidizer because hydrogen peroxide does not generate any harmful byproducts and does not contaminate a semiconductor element.

A concentration of the oxidizer in the etching agent 100 is preferably within a range of 0.2 mol/L to 8 mol/L, more preferably within a range of 2 mol/L to 4 mol/L, and further preferably within a range of 3 mol/L to 4 mol/L.

The etching agent 100 may further contain a buffer. The buffer contains, for example, at least one of ammonium fluoride and ammonia. According to one example, the buffer is ammonium fluoride. According to another example, the buffer is a mixture of ammonium fluoride and ammonia.

The etching agent 100 may further contain other components such as water.

When such an etching agent 100 is used, the material of the substrate 10, i.e. silicon in this embodiment, is oxidized only in regions of the substrate 10 that are close to the catalyst particles 81. Oxide generated thereby is dissolved and removed by hydrofluoric acid. Therefore, only the portions close to the catalyst particles 81 are selectively etched.

The catalyst particles 81 move toward the other main surface (hereinafter, referred to as the "second surface") of the substrate 10 as the etching progresses, and the same etching as the above is performed thereon. As a result, as shown in FIG. 6, at the position of the catalyst layer 80, etching proceeds from the first surface toward the second surface in a direction perpendicular to the first surface.

As described above, the catalyst layer 80 is the particulate layer formed of the catalyst particles 81 containing the noble metal. Accordingly, as the etching progresses, grooves are formed on the sidewalls of the recess as a trace of the etching promoted by the catalyst particle(s) 81. In addition, as described above, the catalyst particles 81 are distributed at a low density. Accordingly, the possibility that the position of a groove generated due to etching promoted by one catalyst particle 81 will partially overlap with the position of a groove generated due to etching promoted by another catalyst particle 81 is low. That is, the possibility that adjacent grooves will partially overlap with each other is low. Therefore, the possibility that an area of regions approximately parallel to the sidewalls will increase due to adjacent grooves partially overlapping with each other is low. That is, the above etching attains the recess having the sidewall on which the plurality of grooves each extending in the depth direction are provided.

Figure 7:
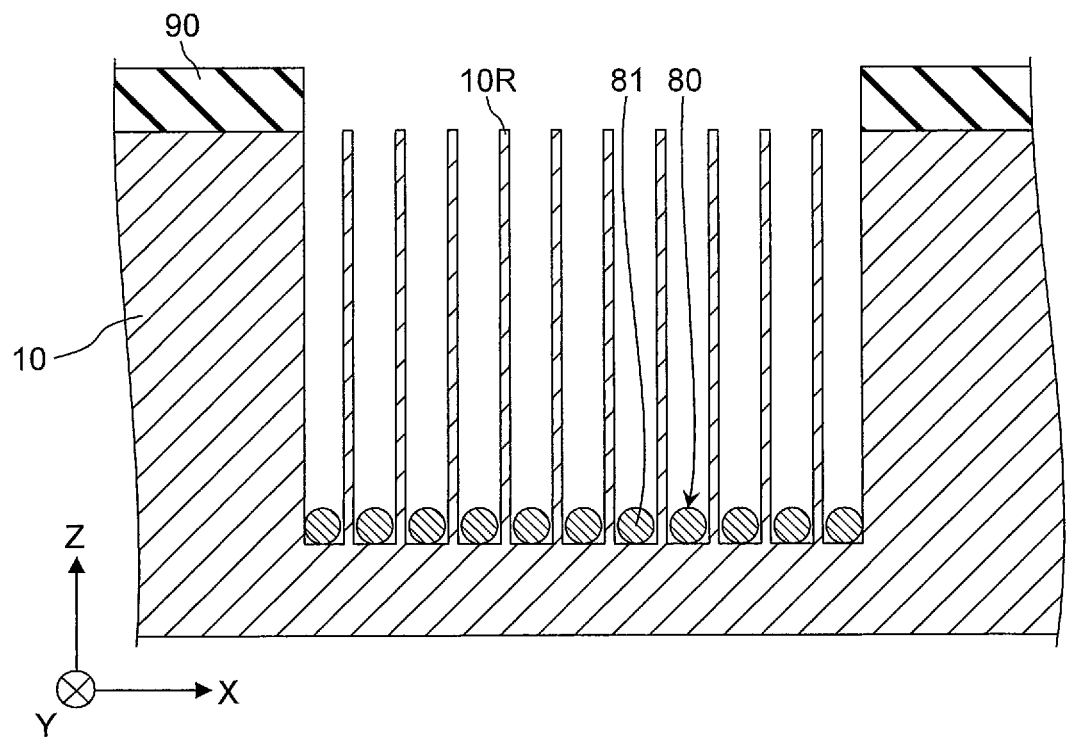
FIG. 7 is a cross-sectional view of a structure obtained through the process of FIG. 6.
Figure 8:
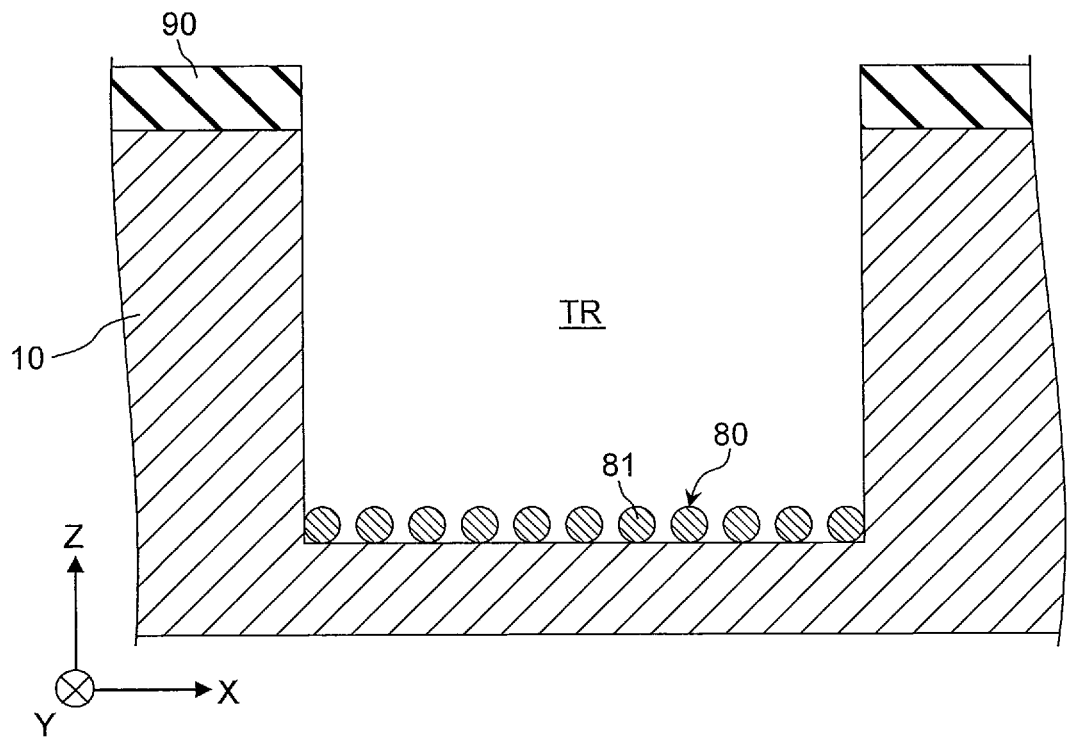
FIG. 8 is a cross-sectional view of a structure obtained through a second etching process performed on the structure of FIG. 7.

However, since the catalyst particles 81 are distributed at a low density, the etching does not progress at positions corresponding to the gaps between the catalyst particles 81. Consequently, as shown in FIG. 6 and FIG. 7, at the bottom of the recess, needle-shaped etching residues 10R extending in a direction of the depth of the recess are generated. The etching residues 10R are removed through a second etching described below, followed by the above etching (the first etching).

The second etching is, for example, isotropic etching. The second etching may be performed by either dry etching or wet etching. When the etching residues 10R are removed by dry etching, for example, a gaseous mixture of $CF_4$ gas and $O_2$ gas is used. When the etching residues 10R are removed by wet etching, for example, an etching solution that causes a large side-etching is used.

Since the etching residues 10R are in the form of a needle, the etching progresses from the entirety of their peripheries. The etching residues 10R thus can easily be removed through etching. Although the second etching also etches the sidewalls of the recess, the grooves on the sidewalls will not be lost provided the etching is ended promptly at the time when the etching residues 10R are eliminated.

In the manner described above, the recess TR shown in FIG. 8 is formed on the first surface.

Thereafter, the mask layer 90 and the catalyst layer 80 are removed from the substrate 10.

Next, the conductive layer 20a shown in FIG. 2 is formed on the substrate 10 to obtain the conductive substrate CS. The conductive layer 20a can be formed by, for example, doping the surface region of the substrate 10 with impurities at a high concentration. The conductive layer 20a made of polysilicon can be formed by, for example, LPCVD (low pressure chemical vapor deposition). The conductive layer 20a made of metal can be formed by, for example, electrolytic plating, reduction plating, or displacement plating.

A plating solution is a liquid containing a salt of a metal to be plated. As the plating solution, a typical plating solution such as a copper sulfate plating solution containing copper sulfate pentahydrate and sulfuric acid, a copper pyrophosphate plating solution containing copper pyrophosphate and potassium pyrophosphate, and a nickel sulfamate plating solution containing nickel sulfamate and boron, can be used.

The conductive layer 20a is preferably formed by a plating method using a plating solution containing a salt of a metal to be plated, a surfactant, and carbon dioxide in a supercritical or subcritical state. In this plating method, the surfactant is interposed between particles made of supercritical carbon dioxide and a continuous phase of a solution containing a salt of a metal to be plated. That is, the surfactant is allowed to form micelles in the plating solution, and supercritical carbon dioxide is incorporated in these micelles.

In a normal plating method, the supply of the metal to be plated may be insufficient in the vicinity of the bottom portions of the recesses. This is particularly noticeable when a ratio of a depth to a width or diameter of the recesses is large.

The micelles incorporating supercritical carbon dioxide can easily enter narrow gaps. As the micelles move, so too does the solution containing a salt of a metal to be plated. Therefore, according to a plating method using a plating solution containing a salt of a metal to be plated, a surfactant, and carbon dioxide in a supercritical or subcritical state, the conductive layer 20a having a uniform thickness can be easily formed.

Next, the dielectric layer 30 is formed on the conductive layer 20a. The dielectric layer 30 can be formed by, for example, CVD (chemical vapor deposition). Alternatively, the dielectric layer 30 can be formed by oxidizing, nitriding, or oxynitriding the surface of the conductive layer 20a.

Next, the conductive layer 20b is formed on the dielectric layer 30. As the conductive layer 20b, for example, a conductive layer made of polysilicon or metal is formed. Such a conductive layer 20b can be formed by, for example, the same method as described above for the conductive layer 20a.

Next, an opening is formed in the dielectric layer 30. The opening is formed at a position of the second region A2. Here, a portion of the dielectric layer 30 that is located on the first main surface S1 is opened in a frame shape. This opening can be formed by, for example, formation of a mask by photolithography as well as patterning by etching.

Next, a metal layer is formed and patterned to obtain the first internal electrode 70a and the second internal electrode 70b. The first internal electrode 70a and the second internal electrode 70b can be formed by, for example, a combination of film formation by sputtering or plating, and photolithography.

Thereafter, the insulating layer 60 is formed. The insulating layer 60 is opened at the positions corresponding to a part of the first internal electrode 70a and a part of the second internal electrode 70b. The insulating layer 60 can be formed by, for example, a combination of film formation by CVD and photolithography.

Next, the first external electrode 70c and the second external electrode 70d are formed on the insulating layer 60. Specifically, the first metal layers 70c1 and 70d1 are formed first. Next, the second metal layers 70c2 and 70d2 are formed. The first metal layers 70c1 and 70d1 and the second metal layers 70c2 and 70d2 can be formed by, for example, a combination of film formation by sputtering or plating, and photolithography.

Thereafter, the structure thus obtained is diced. In the manner described above, the capacitor 1 shown in FIGS. 1 and 2 is obtained.

<Second Production Method For Structure>

A second method of producing a structure according to an embodiment, comprises:

forming a mask layer having one or more openings on one main surface of a substrate including a semiconductor material;

forming a first catalyst layer on a region of the main surface that corresponds to the one or more openings, the first catalyst layer being formed of a plurality of first catalyst particles each including a first noble metal, and having gaps between the plurality of first catalyst particles;

forming a second catalyst layer on the first catalyst layer, the second catalyst layer being formed of a plurality of second catalyst particles each including a second noble metal, at least part of the plurality of second catalyst particles being positioned above the gaps, the second catalyst layer having a smaller width as compared with the first catalyst layer; and supplying an etching agent to the first and second catalyst layers to etch the region with an assist from the first and second catalyst layers as catalysts, thereby forming one or more recesses each having a plurality of grooves extending in a depth direction, on a sidewall.

The second production method will be described below with reference to FIGS. 9 to 11, taking the above-described capacitor 1 as an example structure.

The second production method is the same as the first production method except that the recess TR is formed in a different manner. In the second production method, the recesses TR are formed in a manner described below.

That is, first, in the same manner as described for the catalyst layer 80 in the first production method, a first catalyst layer 80a is formed on a region of the first surface that is not covered with the mask layer 90 as shown in FIG. 9. The first catalyst layer 80a is a particulate layer formed of catalyst particles 81a containing a first noble metal. The first noble metal, first catalyst particles 81a, and first catalyst layer 80a are the same respectively as the noble metal, catalyst particles 81, and catalyst layer 80 in the first production method. That is, materials, numerical ranges and the like described regarding the noble metal, catalyst particles 81, and catalyst layer 80 for the first production method are applicable respectively to the first noble metal, first catalyst particles 81a, and first catalyst layer 80a.

Next, both edges of the first catalyst layer 80a are covered with a second mask layer (not shown). A second catalyst layer 80b is then formed on the first catalyst layer 80a. The thus-obtained second catalyst layer 80b has a smaller width as compared with the first catalyst layer 80a. Note that the second mask layer may be removed or not be removed after the formation of the second catalyst layer 80b.

The second catalyst layer 80b is a particulate layer formed of second catalyst particles 81b containing a second noble metal. At least a portion of the second catalyst particles 81b are positioned over the gaps between the first catalyst particles 81a.

The second noble metal is the same as the noble metal described for the catalyst particles 81 in the first production method. The second noble metal may be the same as or different from the first noble metal.

According to one example, the second catalyst particles 81b have a smaller average particle size as compared with the first catalyst particles 81a. An average particle size of the second catalyst particles 81b is preferably within a range of 0.1 nm to 100 nm and more preferably within a range of 1 nm to 50 nm.

A density of the second catalyst particles 81b in the second catalyst layer 80b is greater than that of the first catalyst particles 81a in the first catalyst layer 80a. Preferably, the second catalyst layer 80b is formed so that a coverage rate, a proportion of a total area of regions covered with the catalyst particles to an area of a region of a semiconductor surface that is not covered with the mask layer, will be from 50% to 100%.

The second catalyst layer 80b can be formed by, for example, the same displacement plating as that for the first catalyst layer 80a except that the plating conditions are changed. That is, the displacement plating (the second displacement plating) for forming the second catalyst layer 80b is performed under milder reaction conditions as compared with the displacement plating (the first displacement plating) for forming the first catalyst layer 80a.

For the second displacement plating, for example, the same displacement plating solution as that described above for the catalyst layer 80 can be used. In the second displacement plating, for example, the same displacement plating solution as that for the first displacement plating is used, and a lower plating-bath temperature and a longer plating time are taken as compared with those in the first displacement plating.

According to one example, the plating solution used in the second displacement plating is an aqueous solution containing 1 mmol/L of tetrchloroaurate (III) and 100 mmol/L of hydrogen fluoride. When such a displacement plating solution is used, the plating is performed at, for example, 10° C. for five minutes.

In the manner described above, the first etching described above is performed after the formation of the catalyst layer 80 composed of the first catalyst layer 80a and the second catalyst layer 80b. The first catalyst particles 81a of the first catalyst layer 80a generate grooves on the sidewalls of the recess. On the other hand, the second catalyst particles 81b of the second catalyst layer 80b promote the etching on the portions remaining in the etching promoted by the first catalyst layer 80a. Therefore, the etching residues 10R shown in FIG. 6 and FIG. 7 are not generated. In addition, since the second catalyst layer 80b is formed to have a smaller width as compared with the first catalyst layer 80a, the second catalyst particles 81b do not eliminate the grooves on the sidewalls of the recess that are generated by the first catalyst particles 81a.

In the manner described above, the recess TR shown in FIG. 11 is formed on the first surface.

Although the capacitor is herein described as an example structure, the techniques described above for the capacitor can be applied to other structures.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A structure comprising:
   a substrate including a semiconductor material, the substrate being provided with one or more recesses each of which has a depth direction that is equal to a thickness direction of the substrate, the one or more recesses including a sidewall on which a plurality of grooves each extending in the depth direction are provided;
   a conductive layer covering the sidewall; and
   a dielectric layer interposed between the substrate and the conductive layer,
   wherein the substrate is a conductive substrate at least a surface of which has electrical conductivity, and the dielectric layer electrically insulates the conductive substrate and the conductive layer from each other.

2. The structure according to claim 1, wherein the one or more recesses are a plurality of trenches arranged in a width direction.

3. The structure according to claim 1, wherein a ratio $D3/Av_{D1}$ of a thickness D3 of the dielectric layer to an average width $Av_{D1}$ of the plurality of grooves is within a range of 0.01 to 1.

4. The structure according to claim 3, wherein a ratio $Av_{D2}/Av_{D1}$ of an average depth $Av_{D2}$ of the plurality of grooves to an average width $Av_{D1}$ of the plurality of grooves is within a range of 0.01 to 100.

5. The structure according to claim 3, wherein an average width $Av_{D1}$ of the plurality of grooves is within a range of 5 nm to 300 nm.

6. The structure according to claim 3, wherein an average depth $Av_{D2}$ of the plurality of grooves is within a range of 2.5 nm to 150 nm.

7. The structure according to claim 3, wherein a ratio $Av_{D1}/Av_{D5}$ of an average width $Av_{D1}$ of the plurality of grooves to an average center-to-center distance $Av_{D5}$ of the plurality of grooves that are adjacent is within a range of 0.3 to 1.

8. A method of producing a structure, comprising:
   forming a mask layer having one or more openings on one main surface of a substrate including a semiconductor material;
   forming a catalyst layer on a region of the main surface that corresponds to the one or more openings, the catalyst layer being formed of a plurality of catalyst particles each including a noble metal, and having gaps between the plurality of catalyst particles;
   supplying an etching agent to the catalyst layer to etch the region with an assist from the catalyst layer as a catalyst, thereby forming one or more recesses each having a plurality of grooves each extending in a depth direction, on a sidewall, and a plurality of etching residues each having a needle shape extending in the depth direction, on a bottom;
   removing the plurality of etching residues through etching;
   forming a dielectric layer on the sidewall; and
   forming a conductive layer on the dielectric layer,
   wherein the substrate is a conductive substrate at least a surface of which has electrical conductivity, and is electrically insulated from the conductive layer by the dielectric layer.

9. The method according to claim 8, wherein a plurality of trenches arranged in a width direction are formed as the one or more recesses.

10. A method of producing a structure, comprising:
    forming a mask layer having one or more openings on one main surface of a substrate including a semiconductor material;
    forming a first catalyst layer on a region of the main surface that corresponds to the one or more openings, the first catalyst layer being formed of a plurality of first catalyst particles each including a first noble metal, and having gaps between the plurality of first catalyst particles;
    forming a second catalyst layer on the first catalyst layer, the second catalyst layer being formed of a plurality of second catalyst particles each including a second noble metal, at least part of the plurality of second catalyst particles being positioned above the gaps, the second catalyst layer having a smaller width as compared with the first catalyst layer; and
    supplying an etching agent to the first and second catalyst layers to etch the region with an assist from the first and second catalyst layers as catalysts, thereby forming one or more recesses each having a plurality of grooves extending in a depth direction, on a sidewall.

11. The method according to claim 10, wherein a plurality of trenches arranged in a width direction are formed as the one or more recesses.

12. The method according to claim 10, further comprising:
    forming a dielectric layer on the sidewall; and
    forming a conductive layer on the dielectric layer,
    wherein the substrate is a conductive substrate at least a surface of which has electrical conductivity, and is electrically insulated from the conductive layer by the dielectric layer.

* * * * *